United States Patent [19]

Massey

[11] Patent Number: 4,694,123
[45] Date of Patent: Sep. 15, 1987

[54] BACKPLANE POWER CONNECTOR SYSTEM

[75] Inventor: Edwin M. Massey, San Jose, Calif.

[73] Assignee: ELXSI, San Jose, Calif.

[21] Appl. No.: 339,034

[22] Filed: Jan. 13, 1982

[51] Int. Cl.$^4$ .............................................. H01B 7/08
[52] U.S. Cl. ............................ 174/117 FF; 174/72 B; 174/117 PC; 361/407; 361/414
[58] Field of Search .................. 174/117 FF, 117 PC, 174/72 B; 361/407, 414

[56] References Cited

U.S. PATENT DOCUMENTS

| | | | |
|---|---|---|---|
| 2,876,530 | 3/1959 | Howatt | 174/117 PC X |
| 2,955,974 | 10/1960 | Allen et al. | 174/117 PC X |
| 3,312,870 | 4/1967 | Rhoades | 361/407 |
| 3,396,230 | 8/1968 | Crimmins | 174/72 B |
| 3,459,880 | 8/1969 | Erdle | 174/117 FF |
| 3,499,218 | 3/1970 | Dahlgren et al. | 361/414 X |
| 3,516,156 | 6/1970 | Steranko | 361/414 X |
| 3,663,866 | 5/1972 | Iosue et al. | 361/414 |
| 3,680,005 | 7/1972 | Jorgensen et al. | 361/414 X |
| 3,893,233 | 7/1975 | Glover | 174/72 B X |
| 4,362,899 | 12/1982 | Borrill | 174/117 PC |

FOREIGN PATENT DOCUMENTS

| | | | |
|---|---|---|---|
| 1465167 | 10/1969 | Fed. Rep. of Germany | 174/72 B |
| 50-40590 | 12/1975 | Japan | 174/72 B |

OTHER PUBLICATIONS

Rieley, S. C.; Laminated Bus System; IBM Technical Disclosure Bulletin; vol. 12, No. 8; Jan. 1970, p. 1268.

*Primary Examiner*—Morris H. Nimmo
*Attorney, Agent, or Firm*—Townsend & Townsend

[57] ABSTRACT

A backplane power distribution system characterized by generally uniform current densities so as to be capable of handling very high levels of current. This is achieved with a stepped backplane construction. For example, in a system having, in order, a first conductive layer, a first dielectric layer, a second conductive layer, and a second dielectric layer, the second conductive and dielectric layers extend transversely beyond the first conductive and dielectric layers to present a substantial exposed area of the second conductive layer. Typically, a rectangular metal bus bar is bolted to the backplane to make contact with the exposed area, and power supply connections to the bus bar are made in any convenient manner.

9 Claims, 3 Drawing Figures

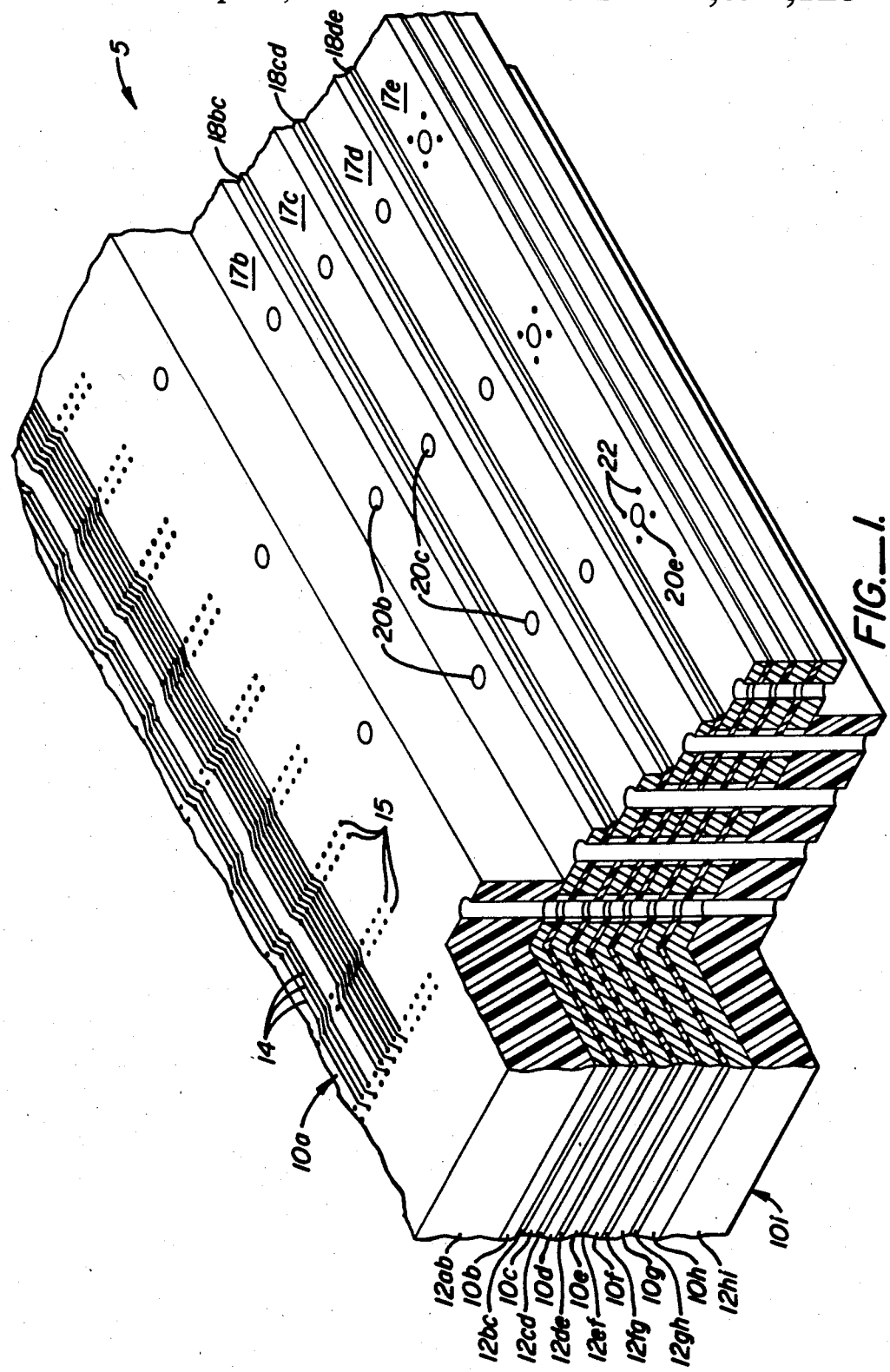
FIG. _1.

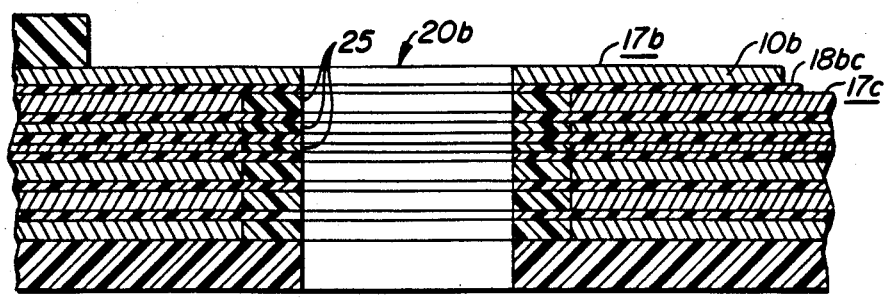
FIG._2.
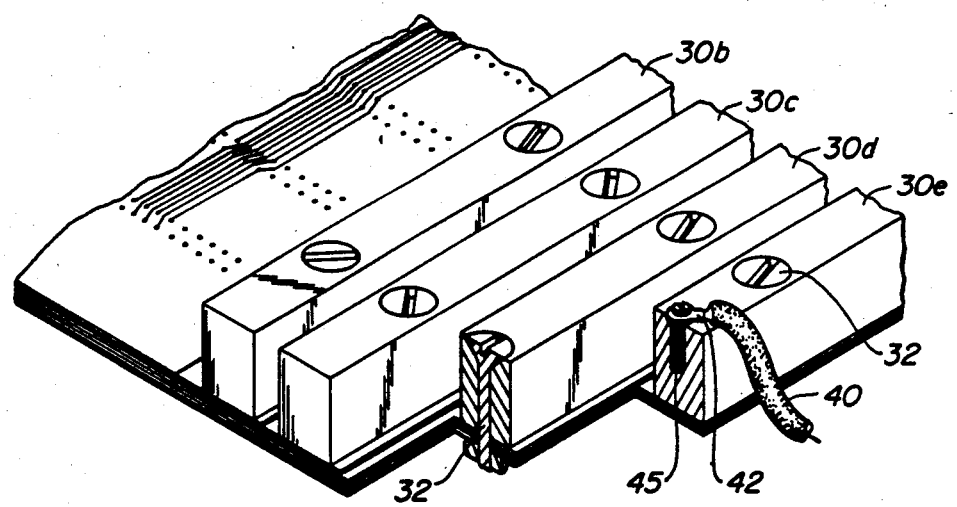
FIG._3.

BACKPLANE POWER CONNECTOR SYSTEM

FIELD OF THE INVENTION

The present invention relates to an improved system for making power connections to the power planes of a computer system backplane.

BACKGROUND OF THE INVENTION

A computer system backplane typically comprises a plurality of conductive layers held rigidly in spaced parallel relation by an interleaved plurality of dielectric layers. While a given dielectric layer has equal significance with respect to the two conductive layers flanking it, one sometimes finds it convenient to conceptualize the backplane as comprising a plurality of coextensive circuit board layers laminated to one another, each layer being of composite construction, including a conductive layer and a dielectric layer. The backplane carries a plurality of parallel multiterminal sockets that receive in an edgewise manner the circuit boards (called "plugboards") on which the computer system components are constructed. Some of the backplane conductive layers are used for signal propagation, and comprise a relatively large number of separate conductive traces running between the parallel transverse sockets. Others of the conductive layers are so called power planes that provide the fixed voltage levels necessary for system operation, and are generally in the form of solid sheets of conductive material (typically copper).

Each socket includes a large plurality of pins that pass through small plated holes bored through all the layers and make electrical contact with a desired one of the backplane conductive layers. Where connection to a given layer is not required, a region surrounding the hole through that particular conductive layer is insulated to prevent the pin from making contact. The plated holes are sized relative to the connector pins for a press fit.

Power supply connections are made in a generally similar manner, but on a larger scale. For example, the plated bore for the power plane connection is of a diameter typically on the order of a quarter inch in diameter, and a solid wire of comparable diameter is soldered in.

It will be appreciated that current is supplied to or drawn from the power plane over a relatively small area, leading to relatively large local current densities. Accordingly, while the prior art power distribution systems tend to be suitable for currents of the order of 20 amps, they are not suitable when it is desired to supply considerably larger currents (perhaps 500 amps).

SUMMARY OF THE INVENTION

The present invention provides a backplane power distribution system characterized by generally uniform current densities, thus according it the capability of handling very high levels of current.

Broadly, this is achieved with a stepped backplane construction. For example, in a system having, in order, a first conductive layer, a first dielectric layer, a second conductive layer, and a second dielectric layer, the second conductive and dielectric layers extend transversely beyond the first conductive and dielectric layers to present a substantial exposed area of the second conductive layer. Typically, a rectangular metal bus bar is bolted to the backplane to make contact with the exposed area, and power supply connections to the bus bar are made in any convenient manner.

The fabrication of a backplane having this stepped configuration is preferably carried out by first laminating the layers to provide a rigid structure having the layers generally coextensive, and then milling successive layers to a depth that exposes the appropriate underlying conductive layer. The requirement that the layers be laminated to produce the rigid structure having coextensivity arises from the nature of the layers themselves prior to lamination. More particularly, the dielectric layer of a given composite layer initially comprises partially cured prepreg material having limited rigidity. During the lamination, under conditions of heat and pressure, the dielectric layer is cured and becomes rigid.

The main advantage of the present invention is that large currents may be supplied to the various power planes. This arises since the bus bar makes good electrical contact with its respective power plane over an extended area (typically many square inches). Furthermore, since the bus bars are typically bolted to the exposed power plane, they may be easily removed and replaced.

For a further understanding of the nature and advantages of the present invention, reference should be made to the remaining portions of the specification and to the attached drawings.

BRIEF DESCRIPTION OF THE DRAWINGS

FIG. 1 is a sectioned isometric view of an edge region of a backplane according to the present invention with the thickness greatly exaggerated relative to the transverse dimensions;

FIG. 2 is a cross sectional view of a portion of the backplane edge region; and

FIG. 3 is an isometric view of the backplane showing the power supply connections.

DESCRIPTION OF THE PREFERRED EMBODIMENT

FIG. 1 is a sectioned isometric view of portions of a backplane 5 according to the present invention. Backplane 5 is a laminated structure comprising a plurality of alternating conductive layers 10a–i and interleaved dielectric layers 12ab, 12bc, ... and 12hi. The conductive layers are typically copper while the dielectric layers are fiberglass-epoxy composites. The numbering scheme with respect to the conductive and dielectric layers is such that each conductive layer has a single letter associated with it, and each dielectric layer has associated therewith the two letters that are associated with the immediately neighboring conductive layers. It is important to note that the thickness of back plane 5 has been exaggerated approximately fifteen times relative to the transverse dimensions in order to show all the layers clearly. This exaggeration is necessary since the conductive layers are normally less than about 0.020 inches thick.

As is well known, such a backplane is typically used to provide a communications medium among various functional units in a computer system. To this end, conductive layers 10a and 10i (latter not explicitly shown) are signal layers while layers 10b–h are so-called power planes for providing particular DC voltage levels to the functional units. Signal layers 10a and 10i are not solid layers, but rather each comprises a plurality of discrete conductive traces 14. For clarity, the thickness of the signal layers has not been exaggerated in FIG. 1.

Table 1 shows thicknesses of both the conductive and dielectric layers as well as the voltage levels for the power planes. These dimensions and levels are given for illustrative purposes only.

TABLE 1

| Layer | Thickness (inches) | Voltage |
|---|---|---|
| 10a | 0.00135 | signal |
| 12ab | 0.027 | |
| 10b | 0.0108 | −2 v |
| 12bc | 0.005 | |
| 10c | 0.0108 | −5 v |
| 12cd | 0.005 | |
| 10d | 0.0054 | +5 v |
| 12de | 0.005 | |
| 10e | 0.0054 | gnd |
| 12ef | 0.005 | |
| 10f | 0.0108 | gnd |
| 12fg | 0.005 | |
| 10g | 0.0108 | gnd |
| 12gh | 0.005 | |
| 10h | 0.0108 | gnd |
| 12hi | 0.027 | |
| 10i | 0.00135 | signal |

A particular functional unit is constructed on a circuit board, commonly called a plugboard, having a linear array of generally rectangular plated contacts along an edge. The plugboard edge plugs into a correspondingly configured socket mounted to the back plane. The socket includes resiliant contacts for engaging the contacts on the plugboard, and each contact is electrically coupled to a corresponding pin. Neither the plugboards nor the sockets are shown. The backplane is formed with a corresponding array of holes 15 that are plated so that the pin makes contact with a desired one of the back plane conductive layers, whether a signal layer or a power plane. Where connection to a given layer is not required, a region surrounding the hole through that particular conductive layer is insulated.

It can be seen that the edge of backplane 5 is of stepped construction wherein at least some of the conductive layers are of different sizes than others and extend beyond others. More particularly, while conductive layers 10e–h are of the same transverse dimension, layers 10b–e are of increasing size relative to one another, thus defining substantial exposed areas 17b–e of each of power planes 10b–e. These exposed areas may be several square inches. A width in the range 0.25–1.0 inches is typical while the longitudinal extent is preferably commensurate with the backplane edge (perhaps 1 foot). Dielectric layers 12bc, 12cd, and 12de each extend a short distance (about 0.05 inches) beyond the overlying (shorter) conductive layer to define dielectric steps 18bc, 18cd, and 18de. The significance of the dielectric steps will be described below with respect to the fabrication process.

The significance of exposed areas 17b–e is that rectangular bus bars (to be described below) are bolted thereagainst to make good electrical contact with the respective power planes. To this end, exposed portion 17b is provided with a plurality of bolt holes 20b, with portions 17c–e each being provided with a similar plurality of bolt holes, designated 20c, 20d, and 20e. Each of holes 20e has associated therewith a plurality of smaller satellite holes 22.

FIG. 2 is a cross-sectional view showing in detail the structure of backplane 5 in the region surrounding one of holes 20b. Other holes are correspondingly configured. While hole 20b extends all the way through the remaining layers of the backplane, it is important that the bolt extending through hole 20b does not make electrical contact with any of the underlying power planes 10c–h (note that hole 20b does not pass near signal plane 10i). Accordingly, each of the power planes except layer 10b has an insulative annulus 25 surrounding hole 20b to prevent the bolt from making contact.

FIG. 3 is an isometric view showing the actual power connections to the power planes. This is accomplished by bolting conductive (e.g., copper) bus bars 30b–e to respective exposed power plane portions 17b–e. Where the exposed portions are about 0.6 inches, bus bars having cross-sectional dimensions of about 0.5 inches by 0.75 inches may be used. Each bus bar is bolted by a sufficient number of counter-sunk machine screws 32 (e.g., size 10-32) to ensure good electrical contact between the bus bar and the respective power plane. Power cables 40, each having an appropriate lug 42, are then bolted to the bus bars with appropriate machine screws 45. Machine screws 45, in contrast to bolts 32, are held in blind tapped holes so that the bus bar and power cable may be removed as an assembly if desired.

Some of the above-described structural features may be better understood with reference to a preferred fabrication sequence. The first step in this sequence is the provision of the copper and dielectric layers to be later laminated. These may be provided as separate copper and dielectric layers, or as a number of composite and possibly dielectric only layers. Typical composite layers are either a copper-dielectric composite or a copper-dielectric-copper composite. In this context, the dielectric layer is prepreg material, typically itself a sandwich having outer gel-cured layers and an inner completely cured layer. Depending on the nature of the composite layers, there may be some ordinary dielectric layers too. All the layers are initially of the same transverse extent.

Prior to lamination of all the layers to form the backplane, each conductive layer is etched with an appropriate pattern. It should be noted that all the pins in the connectors pass through all the layers, so that where connection of a pin to a given layer is not required, the etching step must remove appropriate material in the vicinity of the hole for the particular pin (the holes are drilled later). For power plane bolt holes 20b–e, where connection is not required, oversized circular regions must be etched in order to accommodate insulative annuli 25.

Thereafter, the various layers are laminated under heat and pressure to form a single rigid assembly. Holes 15 for the connector pins and holes 20b–e for the bus bar bolts are then drilled completely through the rigid laminated structure.

The laminated structure is then subjected to a milling step in order to produce the stepped structure described above. The particular details of the milling are within the purview of ordinarily skilled precision machine shop personnel. It is, however, noted that this milling step does require extreme precision in view of the thinness of the individual layers, and is normally carried out on a numerically controlled milling machine. Although the milling step may be approximately described by saying that the structure is milled to a depth to remove a portion of an overlying composite (conductor-dielectric) layer to expose a portion of the underlying conductive layer, it is noted that the milling step is carried out so as to also form dielectric steps 18bc, 18dc, and 18de. This is significant in view of the subsequent plating step.

An alternate to the direct milling described above makes use of a release agent such as silicone-impregnated tape that is deposited prior to the lamination step on those portions of the copper layers that are to be later exposed. The milling is then carried out to a depth that leaves a very thin dielectric layer (perhaps 0.001–0.002 inches) over the portion of the copper that is to be exposed. The thin layer is then separated from the underlying copper and broken off to expose the underlying copper. The release agent allows the separation to occur, while the extreme thinness of the milled layer facilitates the removal. The advantage of this approach is that it does not depend on the copper layer's being absolutely flat.

It will be appreciated that so long as the release agent covers the entire area of the copper layer to be exposed, the milling need not be carried out over the entirety of this area. Rather, the fabrication may be carried out by milling a relatively narrow strip adjacent the step location, leaving the full thickness of the overlying composite layer over the remainder of the area to be exposed. This defines a very thin and relatively narrow web portion which still allows separation of the entire portion of the overlying composite layer to occur at the interface with the release agent.

The milled assembly is then subjected to a plating step such as a solder dip wherein all exposed portions of conductive material are coated with a nonoxidizing layer (e.g., solder). During the plating step, dielectric steps 18*bc*, 18*cd*, and 18*de* act as barriers that prevent the plating material from bridging the gap between successive exposed portions of the conductive layers. In this regard, it is useful to remember that FIG. 1 is greatly exaggerated in thickness, and that the dielectric steps, while having a 1/16-inch transverse dimension, are only approximately 0.005 inches thick which would easily be bridged by the plating material in the absence of their transverse extent. During this plating, the dielectric gaps within holes 20*e* and 22 are plated over so that there results in each a continuous plated bore electrically coupling conductive layers 10*e–h*. The use of plural thin ground plane layers, rather than a single thick one, is not dictated by any intrinsic advantage, but rather by considerations of ease of manufacture. While plated holes 20*e* provide an effective conduction path between the various ground planes, satellite holes 22 provide additional contact, increasing the contact by approximately a factor of 2.

In summary, it can be seen that the present invention provides a power plane configuration that permits high current levels. The connections of the bus bars to the backplane are such that the backplane may be disconnected from the power supplies by the expedient of unbolting all the bus bars, leaving the lugs bolted into their respective bus bars.

While the above provides a full and complete disclosure of the preferred embodiment of the invention, various modifications, alternate constructions and equivalents may be employed without departing from the true spirit and scope of the invention. For example, while the exposed portions of the conductive layers are preferably rectangular strips along one or more edges of the backplane, other configurations are possible should the requirement arise. Therefore, the above description and illustrations should not be construed as limiting the scope of the invention, which is defined by the appended claims.

I claim:

1. In a backplane power distribution system having a laminated series of circuit boards comprising, in order, a first conductive layer, a first dielectric layer, a second conductive layer, and a second dielectric layer, the improvement wherein said second conductive and dielectric layers extend transversely beyond said first conductive and dielectric layers to define a substantial extended exposed flat surface portion of said second conductive layer, the improvement further comprising a rectangular bus bar in direct contact with said flat surface portion to facilitate electrical connection thereto.

2. A backplane power distribution system comprising:

a laminated series of circuit boards having, in order,
a first conductive layer,
a first dielectric layer,
a second conductive layer, and
a second dielectric layer, said second conductive and dielectric layers extending transversely beyond said first conductive and dielectric layers to define a substantial extended exposed flat surface portion near an edge of said second conductive layer, said first dielectric layer extending transversely beyond said first conductive layer by an amount less than the amount by which said second conductive layer extends beyond said first conductive layer to define a plating barrier; and a rectangular bus bar in direct contact with said flat surface portion of said second conductive layer to facilitate electrical connection thereto.

3. In the backplane power distribution system of claim 1, the further improvement wherein said first dielectric layer extends transversely beyond said first conductive layer by an amount less than the amount by which said second conductive layer extends beyond said first conductive layer to define a plating barrier.

4. In the backplane power distribution system of claim 1, the further improvement wherein said exposed portion of said second conductive layer is near an edge of said second conductive layer.

5. In the backplane power distribution system of claim 1, the further improvement wherein said first and second conductive layers are copper, and wherein said exposed portion of said second conductive layer is plated with a nonoxidizing conductive material.

6. In the backplane power distribution system of claim 1, the further improvement wherein said first and second conductive layers are less than about 0.020 inches thick, and said exposed portion has an area of at least several square inches.

7. The backplane power distribution system of claim 2 wherein said first and second conductive layers are copper, and wherein said exposed portion of said second conductive layer is plated with a nonoxidizing conductive material.

8. The backplane power distribution system of claim 2 wherein said first and second conductive layers are less than about 0.020 inches thick, and said exposed portion has an area of at least several square inches.

9. A backplane comprising a laminated circuit board structure having the following layers in the order stated:

a first conductive layer comprising a plurality of discrete signal traces;

a first dielectric layer on which said signal traces are supported;

a second conductive layer defining a first power plane;

a second dielectric layer;

a third conductive layer defining a second power plane; and a third dielectric layer;

said second conductive and dielectric layers extending transversely beyond said first conductive and dielectric layers to define a substantial extended exposed flat surface portion of said first power plane near an edge of said first power plane;

said third conductive and dielectric layers extending transversely beyond said edge of said second conductive layer to define a substantial extended exposed portion of said second power plane near an edge of said second power plane; and first and second rectangular bus bars sized relative to said exposed portions of said first and second power planes to make direct contact with said flat surface portions to allow power supply connections to be made to said first and second power planes;

there being formed a plurality of holes through said first, second, and third conductive and dielectric layers to allow pin connections to be made to at least one of said power planes.

* * * * *